United States Patent [19]
Kimura

[11] Patent Number: 5,436,178
[45] Date of Patent: Jul. 25, 1995

[54] METHOD OF MAKING SEMICONDUCTOR DEVICE INCLUDING MOS TYPE FIELD EFFECT TRANSISTOR

[75] Inventor: Hiroshi Kimura, Hyogo, Japan

[73] Assignee: Mitsubishi Denki Kabushiki Kaisha, Tokyo, Japan

[21] Appl. No.: 186,495

[22] Filed: Jan. 26, 1994

Related U.S. Application Data

[63] Continuation of Ser. No. 820,127, Jan. 14, 1992, abandoned.

Foreign Application Priority Data

Jan. 21, 1991 [JP] Japan .................. 3-005404

[51] Int. Cl.⁶ .......................................... H01L 21/265
[52] U.S. Cl. .......................................... 437/30; 437/27; 437/41; 437/43; 437/44; 437/149; 437/186; 437/913; 257/327; 257/336
[58] Field of Search .................. 257/327, 345, 336; 437/25, 27, 30, 46, 43, 44, 41, 62, 149, 186, 913

[56] References Cited

U.S. PATENT DOCUMENTS

| | | | |
|---|---|---|---|
| 4,843,023 | 6/1989 | Chiu et al. | 437/34 |
| 4,914,500 | 4/1990 | Liu et al. | 257/327 |
| 4,992,389 | 2/1991 | Ogura et al. | 437/41 |
| 5,024,959 | 6/1991 | Pfiester | 437/34 |
| 5,141,891 | 8/1992 | Arima et al. | 257/336 |
| 5,177,571 | 1/1993 | Satoh et al. | 257/336 |

FOREIGN PATENT DOCUMENTS 62-7703 2/1987 Japan .

OTHER PUBLICATIONS

"Computer Analysis of Punch-Through in MOSFETs", N. Kotani and S. Kawazu, Solid-State Electronics, vol. 22, No. 1-E, 1979, pp. 63-70.

*Primary Examiner*—Olik Chaudhuri
*Assistant Examiner*—Long Pham
*Attorney, Agent, or Firm*—Lowe, Price, LeBlanc & Becker

[57] ABSTRACT

A semiconductor device includes an MOS field effect transistor having a structure in which the tops of its source/drain regions are covered with a polycrystalline silicon layer. The impurity concentration distribution in its depth direction of the source/drain regions of the MOS field effect transistor is such that the concentration is sufficiently high in an area necessary to have conductivity a prescribed depth away from the surface of the semiconductor substrate, and the impurity concentration drastically decreases in areas deeper than that. Thus, a punch through phenomenon in positions relatively deep in the channel region is suppressed, and an MOS field effect transistor having its channel length reduced to 0.5 μm and less and achieving high performance can be obtained. Such an MOS field effect transistor can be produced by implanting an impurity a number of times, controlling appropriately the peak value and the peak position of the impurity concentration, before and after or only after the formation of the polycrystalline silicon layer.

15 Claims, 11 Drawing Sheets

CORRESPONDING TO ABSCISSA OF FIG. 9B

METHOD OF MAKING SEMICONDUCTOR DEVICE INCLUDING MOS TYPE FIELD EFFECT TRANSISTOR

This application is a continuation of application Ser. No. 07/820,127 filed Jan. 14, 1992 now abandoned.

BACKGROUND OF THE INVENTION

Field of the Invention

The present invention relates generally to a semiconductor device including a MOS (Metal Oxide Semiconductor) field effect transistor and a manufacturing method thereof, and more specifically, to a technique which allows preventing of punch through phenomenon and miniaturization of channel lengths.

Description of the Background Art

With high-density integration of semiconductor circuit devices in recent years, it has been an important object to achieve successfully the delicate adjustment of impurity concentration distribution in the depth direction of an impurity diffusion layer to be source/drain regions, in order to maintain the design characteristics of MOS field effect transistors.

Now, description will be provided on a process of forming an impurity diffusion layer to be the source/drain regions of a conventional MOS field effect transistor (e.g. see Japanese Patent Publication No. 62-7703) by way of illustration in conjunction with FIGS. 1A through 5B. FIGS. 1A through 5B show sequentially the process of forming an impurity diffusion layer to be source/drain regions and the resulting impurity concentration distributions in the depth direction, i.e., as a function of depth from the surface of the substrate, in an MOS field effect transistor having a conductive layer formed of polycrystalline silicon to be connected to the source/drain regions and using the conductive layer as an interconnection.

In the process of forming this conventional MOS field effect transistor, referring to FIG. 1A, after the surface and sidewalls of a gate electrode 3 formed on the surface of a p type semiconductor substrate 1 with a gate insulating film 2 therebetween are covered with an insulating film 4, an n type impurity is implanted into the surface of semiconductor substrate 1 under prescribed conditions. Impurity concentration distribution in its depth direction immediately after implanting arsenic, for example, as the n type impurity at an implantation energy of 60 KeV, in a dose of $1 \times 10^{15}/cm^2$ is shown in a graphic representation in FIG. 1B.

An impurity diffusion layer 5 is thereafter formed by means of prescribed thermal treatment. (see FIG. 2A.) The concentration distribution of the impurity in its depth direction after the thermal diffusion varies rather gently as shown in FIG. 2B as compared to that immediately after the implantation.

Referring to FIG. 3, a polycrystalline silicon layer 6 is deposited as thick as approximately 1500 Å, and patterning is performed so as to cover at least the surface of impurity diffusion layer 5. Thereafter, an n type impurity is implanted so that the peak of the impurity concentration is in polycrystalline silicon layer 6. (see FIG. 4A.) The concentration distribution of the impurity in its depth direction in the above-described state is as shown in FIG. 4B, if arsenic, for example, is implanted at 60 KeV, in a dose of $1 \times 10^{15}/cm^2$.

The impurity in polycrystalline silicon layer 6 is activated by means of another thermal treatment, rendering polycrystalline silicon layer 6 conductive. (see FIG. 5A.) The concentration distribution of the impurity in its depth direction in the above-described state is as shown in FIG. 5B.

In the case of a very small MOS field effect transistor having a channel length less than 1.0 μm, especially less than 0.5 μm, the depth of a region having a concentration more than the minimum concentration [B] ($1 \times 10^{19}/cm^3$ in FIG. 5B) which effects on electrical conduction is [C] (approximately 0.25 μm in FIG. 5B) in order to keep the peak impurity concentration of impurity diffusion layer 5 at the level of concentration [A] (about $10^{20}/cm^3$ in FIG. 5B) necessary for keeping the resistance of impurity diffusion layer 5 low. When the depth [C] attains the level with little effect of the field created by gate electrode 3 formed on the surface of semiconductor substrate 1, voltage applied to the drain allows a depletion layer extend into semiconductor substrate 1 and further to reach the source, resulting in more frequent occurrence of a so-called punch through phenomenon. The state inside semiconductor substrate 1 at that time is shown by potential line distribution illustrating a cross section of a MOS field effect transistor with a channel length of 1 μm in its channel lengthwise direction (see FIG. 6A) and by electron density distribution (see FIG. 6B). FIGS. 6A and 6B are published in Solid State Electronics Vol. 22, 1979, P69. It can be understood from these figures that the equipotential lines of source/drain regions come close to each other at point S in FIG. 6A and the density of electrons is higher in a channel region at a position as deep as the source/drain region having an electron density of $10^{20}/cm^3$ than in the surface of semiconductor substrate 1. A graphic representation in FIG. 7 illustrates the relation between drain voltage $V_{DS}$ and drain current $I_D$, using a gate voltage $V_{GS}$ as a parameter. As can be seen from FIG. 7, even if the gate voltage $V_{GS}$ is set to be 0 V, the drain current $I_D$ flowing between the source/drain regions can not be nullified, and, therefore, the drain current $I_D$ cannot be controlled by the value of $V_{GS}$. Application of such a MOS field effect transistor, for example, to a DRAM (Dynamic Random Access memory) can give rise to troubles in the device, and it has been difficult to form a very small MOS field effect transistor having a channel length less than 1 μn.

The factors responsible for the above-described problem as well as ideal concentration distribution in the direction of the depth of impurity diffusion layer 5 for solving this problem will be illustrated by a typical example of simplified model shown in FIGS. 8A to 8C.

Assume, for example, a MOS field effect transistor having a cross sectional structure of a simplified model as shown in FIGS. 8A and 8B. FIG. 8A sets forth a case in which the depth of a source/drain region (impurity diffusion layer 5) from the surface of semiconductor substrate 1 is relatively large, and FIG. 8B sets forth a case in which the depth is small as compared to the former FIG. 8A case. With the concentration density of the p type impurity of semiconductor substrate 1 being constant, when gate electrode 3 is grounded, the depth of semiconductor substrate 1 which is affected by the electric field is naturally decided. The part indicated by broken declined lines in FIGS. 8A and 8B shows a range which can be controlled by the electric field so as not to be inverted when gate electrode 3 is grounded.

As shown in FIG. 8B, if impurity diffusion layer 5 is within the range which can be controlled by gate electrode 3, there will be no punch through, but if, as shown in FIG. 8A, the bottom of impurity diffusion layer 5 is beyond the range of control by gate electrode 3, current flows through this deep part, resulting in punch through.

However, if impurity diffusion layer 5 is too shallow, the resistance of current flowing through the part becomes too high, and therefore, the adjustment of the depth of impurity diffusion layer 5 is one significant matter.

SUMMARY OF THE INVENTION

It is an object of the present invention to provide a semiconductor device including an MOS field effect transistor which permits the channel length of the device reduced to less than 0.5 μm by restricting punch through and a manufacturing method of such a device.

In order to achieve the above-described object, a semiconductor device including an MOS field effect transistor in accordance with the present invention includes a gate electrode formed on the main surface of a semiconductor substrate with a gate insulating film therebetween, impurity diffusion layers of a second conductivity type as source/drain regions formed in the vicinity of the surface of the semiconductor substrate and positioned on the opposing sides interposing therebetween a channel region of a first conductivity type formed in the surface of the semiconductor substrate in the lower part of the gate electrode, and a conductive layer formed of polycrystalline silicon so as to cover at least this impurity diffusion layer. The impurity concentration distribution of the impurity diffusion layers as a function of depth in the substrate is higher than a prescribed value to keep said diffusion layers conductive to a minimum depth in the substrate. Beyond the minimum depth the current flow between the impurity diffusion layers is not significantly influenced by an electric field developed by the gate electrode in response to a gate control voltage, and from there the impurity concentration diffusion of the impurity diffusion layer than the prescribed value and decreasing monotonically at least to a prescribed depth in the substrate.

In such a structure, the concentration of the impurity of the impurity diffusion layer constituting the source/drain regions has a peak value necessary for creating prescribed conductivity in the surface of the semiconductor substrate, and the depth having a concentration to affect the conductivity can be kept relatively small. Therefore, this restricts the cause for punch through, the formation of the depletion layers of the channel region deeply located from the semiconductor substrate.

The impurity diffusion layer forming source/drain regions of a semiconductor device including an MOS type field effect transistor according to the present invention gives an impurity concentration distribution which can be generally represented by a mathematical formula as follows.

More specifically, the impurity concentration distribution $N(x)$ originated from the main surface of the semiconductor substrate and perpendicular to the main surface is represented as:

$$N(x) = \sum_{k=1}^{n} \{N_{ik}/(\sqrt{2\pi} \cdot \Delta Rpk)\} \exp\{-(x - Rpk)^2/(2 \cdot \Delta Rpk^2)\}$$

where $N_{ik}$ is the amount of impurity implanted per unit volume of the main surface of the semiconductor substrate by the first implantation, Rpk is the average of the range of the implanted ions from the main surface of the semiconductor substrate in the semiconductor substrate, ΔRpk is standard deviation of the range of the implanted impurity ions in the semiconductor substrate from the main surface of the semiconductor substrate, and n is the number of ion implantation, which is a natural number equal to or larger than 2.

Additionally, the following inequalities hold:

$$Rp1 < Rp2 < \ldots < Rpn, \; Ni1 \geq Ni2 \geq Ni3 \geq \ldots \geq Nin$$

and $Rpj < 0$ holds where j is a prescribed natural number which is not less than 1 and not more than n.

In a manufacturing method of a semiconductor device including an MOS field effect transistor in accordance with the present invention, a gate electrode is formed on the main surface of a semiconductor substrate with a gate oxide film therebetween. Then, a polycrystalline silicon layer is formed so as to cover the surfaces of source/drain regions on the opposing sides with a channel of a first conductivity type therebetween which is positioned in the surface of the semiconductor substrate in the lower part of the gate electrode. Then, in a step after or before forming the polycrystalline silicon layer, an impurity of a second conductivity type is implanted into the polycrystalline silicon layer and the source/drain regions a number of times. At each time of implantation, implantation energy and a dose are appropriately selected so that the peak of the distribution of the impurity concentration in its depth direction is within the range of the depth of either the polycrystalline silicon layer or the source/drain regions whose resistance is to be kept low. The distribution of the impurity concentration in its depth direction from the surface of the semiconductor substrate is thus controlled.

In accordance with such a manufacturing method, the source/drain regions, in the concentration distribution of the impurity, have an appropriately high concentration as deep as necessary to have conductivity, and have drastically reduced concentrations in deeper positions.

In this manufacturing method, more specifically, an interlayer insulating film for covering the top and sidewalls of the gate electrode is formed before the step of forming the polycrystalline silicon layer, and the impurity is implanted before the step of forming the polycrystalline silicon layer using the gate electrode and the interlayer insulating film as masks.

In another aspect of a method of manufacturing a semiconductor device including an MOS field effect transistor in accordance with the present invention, an impurity is implanted into a polycrystalline silicon layer and source/drain regions a number of times only after a step of forming the polycrystalline silicon layer.

In this method, the step of forming the polycrystalline silicon layer is not inserted in the middle of the step of impurity implantation, and, therefore, the plural times of impurity implantation can be conducted serially and thereby efficiently.

The step of impurity implantation in this manufacturing method includes, more specifically, a first impurity implantation step of implanting an impurity of a second conductivity type so that the peak of the concentration distribution of the impurity is a prescribed depth away from the surface of the semiconductor substrate, and a second impurity implantation step of implanting an impurity of the second conductivity type so that the peak of the concentration distribution of the impurity is in the polycrystalline silicon layer.

According to a preferred embodiment of this manufacturing method, the step of impurity implantation further includes a third impurity implantation step of implanting an impurity of the second conductivity type so that the peak of the concentration distribution of the impurity is in the vicinity of the surface of the semiconductor substrate.

As described above, the concentration distribution of the impurity of the source/drain regions in its depth direction can be controlled more flexibly by increasing the number of impurity implantation with their implantation conditions being changed.

After the impurity implantation in the step of controlling the concentration distribution of the impurity is completed, thermal treatment is conducted for the purpose of activating the implanted impurity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be illustrated in conjunction with the drawings.

Figure 9A:
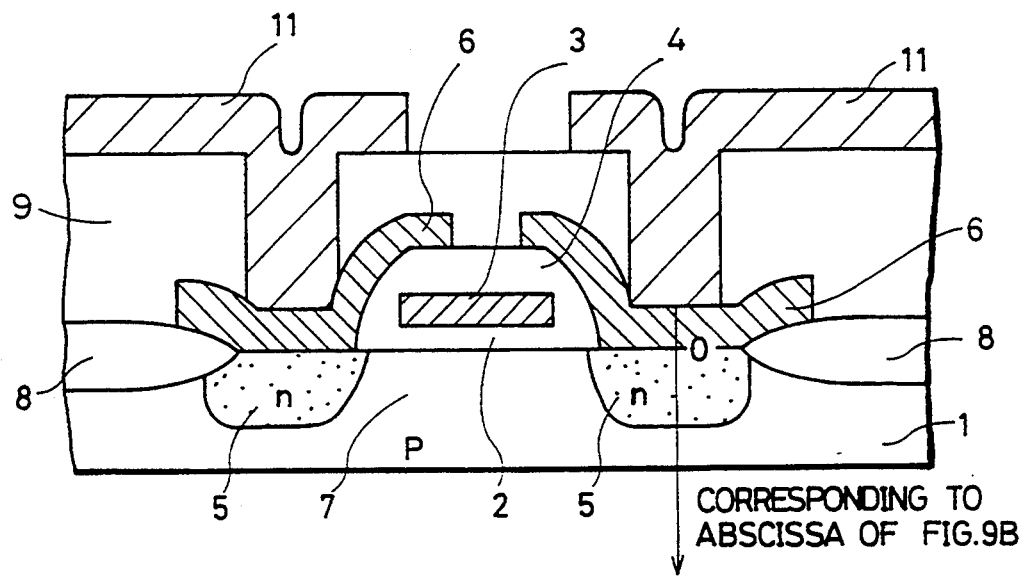
FIG. 9A is a sectional view showing a structure of an MOS field effect transistor in accordance with one embodiment of the present invention, FIG. 9B showing the distribution of the impurity concentration in its depth direction.
Figure 9B:
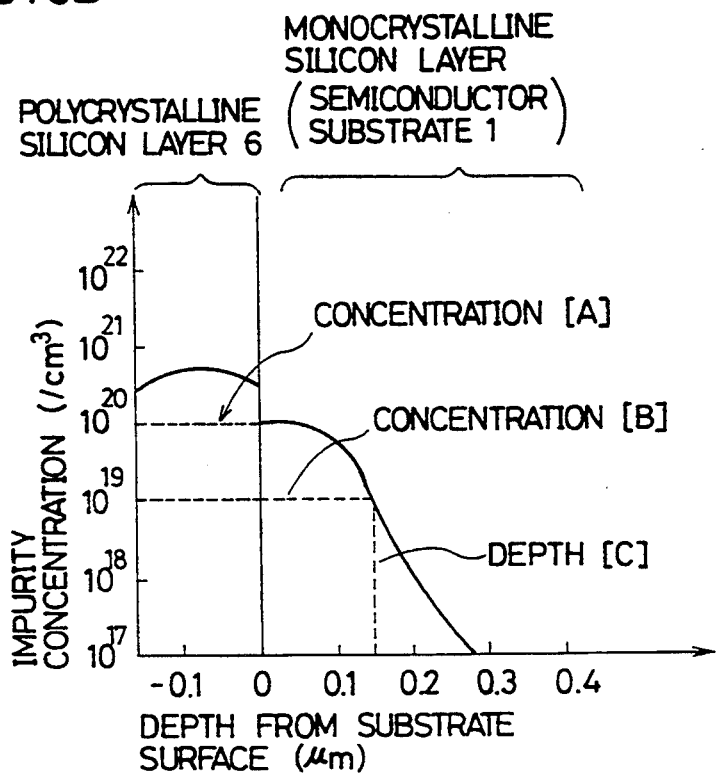

In this embodiment, an MOS field effect transistor has a sectional structure as shown in FIG. 9A, and the concentration distribution of an impurity in its depth direction is as shown in FIG. 9B. More specifically, the MOS field effect transistor of the present embodiment, referring to FIG. 9A, has a gate electrode 3 formed on one of a plurality of active regions, isolated by a field insulating film 8, on the main surface of a semiconductor substrate 1 formed of p type polycrystalline silicon, with a gate insulating film 2 therebetween. The top and sidewalls of gate electrode 3 are covered with an insulating film 4, and impurity diffusion layers 5 to be source/drain regions are formed in a pair of regions on the opposing sides with a channel region 7 therebetween which is in the lower part of gate electrode 3 in the vicinity of the surface of semiconductor substrate 1. Furthermore, a polycrystalline silicon 6 to be a conductive layer is formed in a prescribed pattern, covering at least the surface of impurity diffusion layers 5.

Furthermore, an interlayer insulating layer 9 is formed on the whole surface of the semiconductor substrate 1, and conductive interconnecting layers 11 formed on the interlayer insulating layer 9 are connected to the polycrystalline layers 6 at contact holes made in the interlayer insulating layer 9.

An n type impurity such as phosphorous having a concentration of $10^{20}/cm^3$ and more is diffused in polycrystalline silicon layer 6 as shown in FIG. 9B, and polycrystalline silicon layer 6 functions as a conductive layer as a result. In the concentration distribution of the impurity of impurity diffusion layer 5, as shown in FIG. 9B, the peak concentration [A] (about $10^{20}/cm^3$ in FIG. 9B) of the concentration distribution of the impurity necessary for giving conductivity to impurity diffusion layer 5 is provided in the surface of semiconductor substrate 1, and is reduced relatively gently as a function of depth. Consequently, a depth [C] which has the minimum concentration [B] (about $10^{19}/cm^3$ in FIG. 9B] to effect conductivity is relatively small. (about 0.15 $\mu$m in FIG. 9B.) An area having such a depth can be controlled by voltage applied from gate electrode 3, and punch through due to the extension of a depletion layer between the source/drain regions, in other words in a channel region 7 is less likely to take place.

The reason for providing such an impurity concentration distribution as shown in FIG. 9B in the present embodiment is as follows.

Figure 8A:
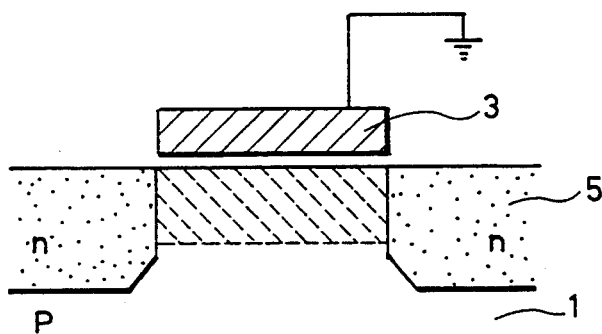
FIGS. 8A, 8B and 8C are representations for illustrating the relation between the depth of impurity diffusion layer 5 and the occurrence of punch through, etc., and an ideal concentration distribution in the impurity diffusion layer to which the present invention is directed to, by way of assuming a simplified model of the distribution of the impurity concentration.
Figure 8B:
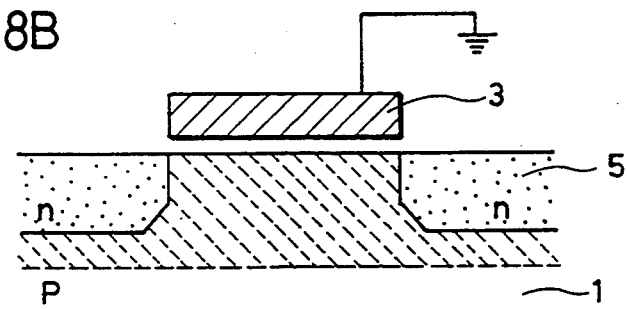

In order to prevent problems associated with impurity diffusion layer 5 being too deep or too shallow as shown in FIGS. 8A and 8B, the impurity concentration is set as high as possible for securing the conductivity of impurity diffusion layer 5 in the range of depth in which control by gate electrode 3 is possible, and, on the other hand, it is desirable to keep the impurity concentration as low as possible in the range of depth in which the control by the gate electrode is not possible.

Figure 8C:
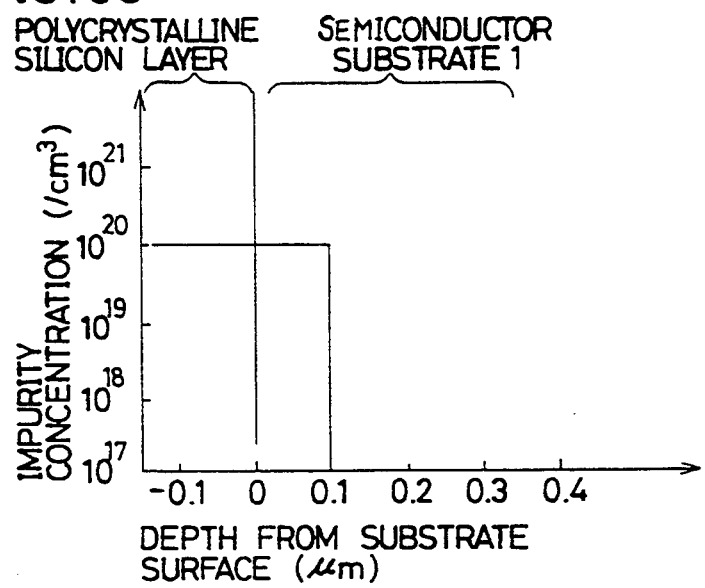

Therefore, an ideal impurity profile as a function of depth in the source/drain regions is believed to be a step-shaped profile as shown in FIG. 8C. Especially, in the case of an MOS field effect transistor having a gate length of 1.0 $\mu$m and less, punch through is likely to take place between its source/drain regions. Taking into account this point, the impurity concentration is desirably as low as possible in positions as deep as 0.1 $\mu$m and more. In regions having a depth 0.1 $\mu$m or less from the surface of semiconductor substrate 1, the impurity concentration is desirably as high as possible. However, careless increase in the amount of implantation can disturb activation of the impurity, and therefore, the concentration is preferably somewhere around $1 \times 10^{20}/cm^3$. It is known however that necessary conductivity can be secured for the source/drain regions if the peak value of the impurity concentration distribution in its depth direction is around $10^{20}/cm^3$.

However, the step-shaped profile shown in FIG. 8C is nothing more than an ideal one, and is almost impossible to achieve in practice, because of the diffusion of the impurity due to thermal treatment process, etc. for activating the implanted impurity.

Therefore, an impurity concentration distribution as shown in FIG. 9B is selected in the present embodiment, as an impurity concentration distribution possible to be achieved and as close as possible to the ideal distribution as described above.

Figure 1A:
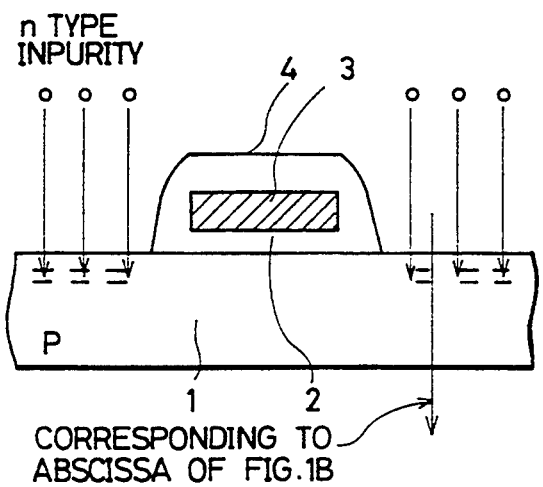
FIG. 1A is a sectional view showing a step of implanting an n type impurity into the surface of a semiconductor substrate 1, in a process of manufacturing a conventional MOS field effect transistor, FIG. 1B showing the concentration distribution of the impurity in its depth direction immediately after the implantation.
Figure 1B:
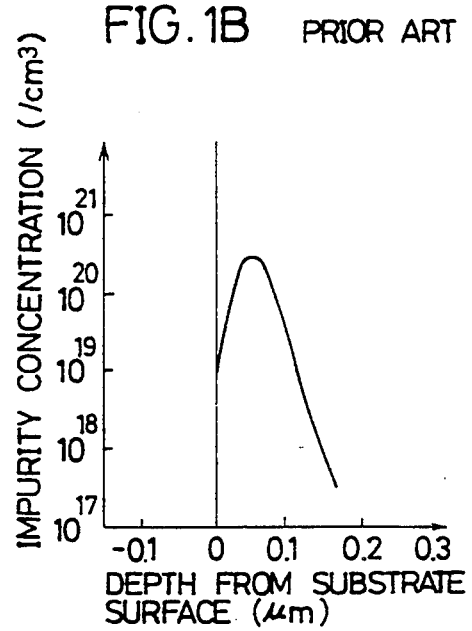
Figure 2A:
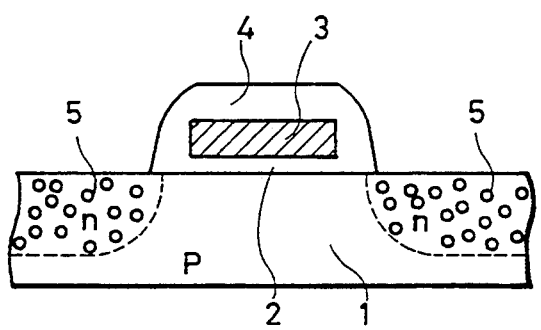
FIG. 2A is a sectional view showing a structure after an impurity diffusion layer 5 is formed diffusing the impurity by means of thermal treatment, subsequent to the step of implanting the n type impurity shown in FIG. 1A, FIG. 2B showing the concentration distribution of the impurity in its depth direction.
Figure 2B:
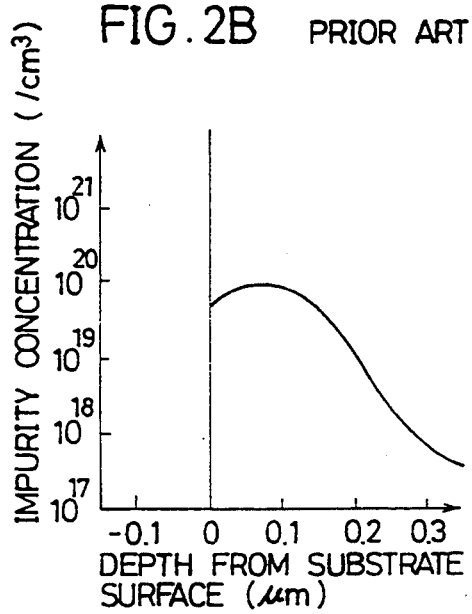
Figure 3:
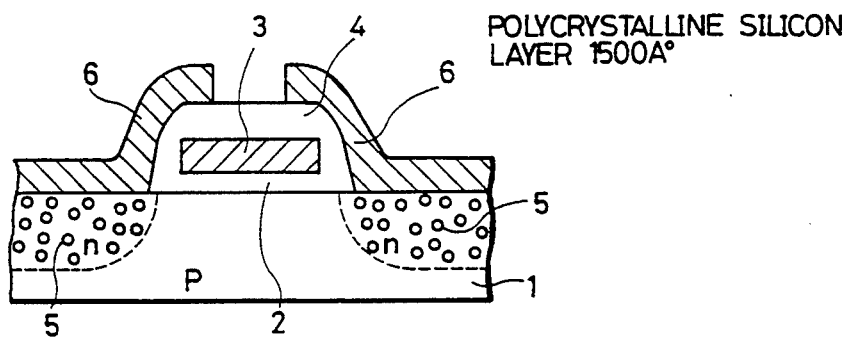
FIG. 3 is a sectional view showing a state in which a polycrystalline silicon layer 6 is formed by patterning after the step shown in FIG. 2A.
Figure 4A:
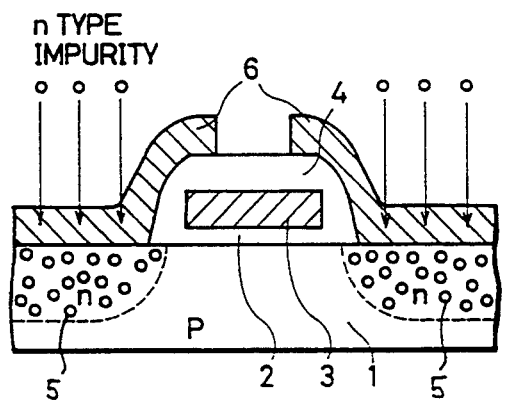
FIG. 4A is a view showing a step of implanting an n type impurity into polycrystalline silicon layer 6 after the step in FIG. 3, FIG. 4B showing the concentration distribution of the impurity in its depth direction after the implantation.
Figure 4B:
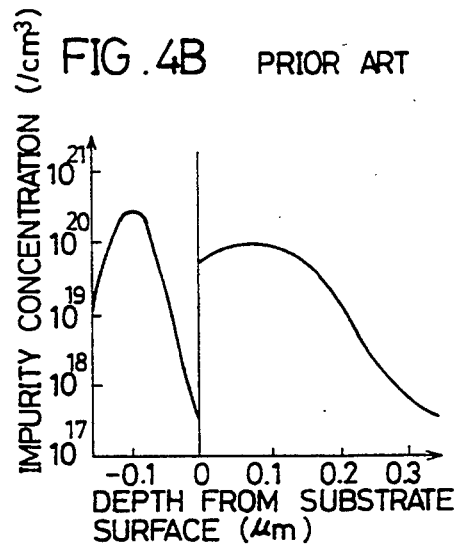
Figure 5A:
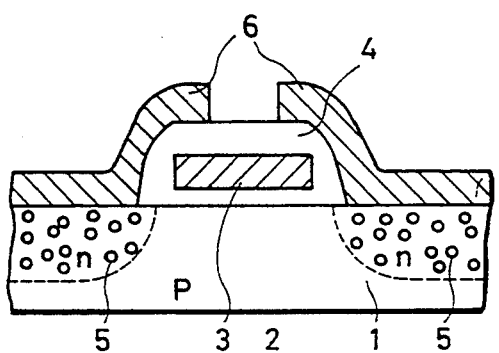
FIG. 5A is a sectional view showing a structure after the impurity of polycrystalline silicon layer 6 is diffused by means of thermal treatment after the step shown in FIG. 4A, FIG. 5B showing the concentration distribution of the impurity in its depth direction at that time.
Figure 5B:
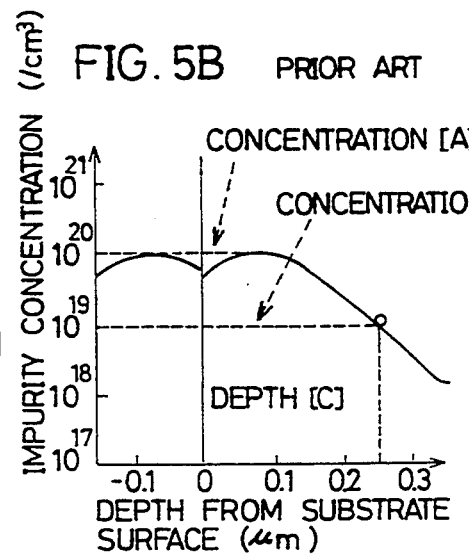
Figure 6A:
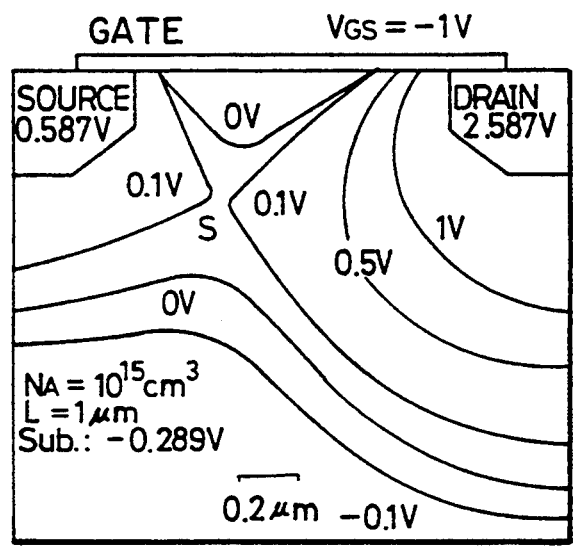
FIG. 6A is a view showing the distribution of equipotential lines in a vertical cross section in the direction of the channel length of the conventional MOS field effect transistor shown in FIG. 5A, FIG. 6B showing the distribution of electron density in the section.
Figure 6B:
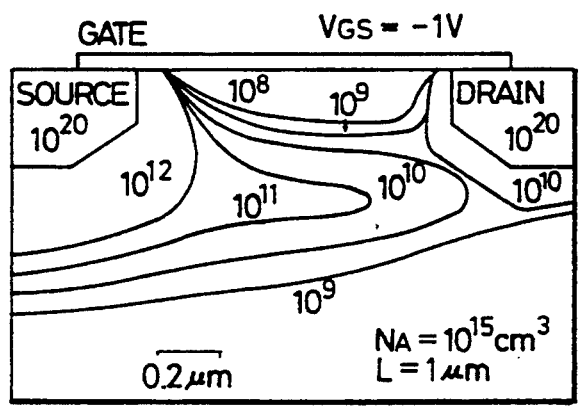
Figure 7:
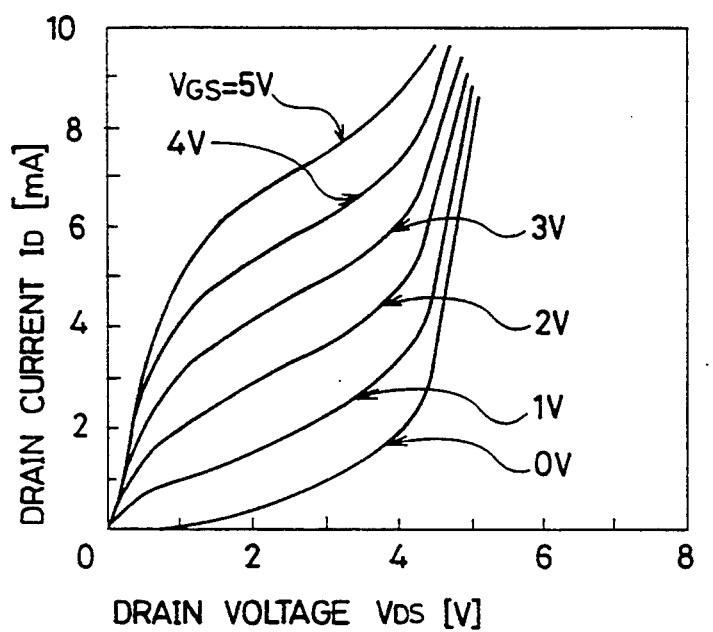
FIG. 7 is a graphic representation showing the drain voltage $V_{DS}$-drain current $I_D$ characteristics of the conventional MOS field effect transistor shown in FIG. 5A.
Figure 10:
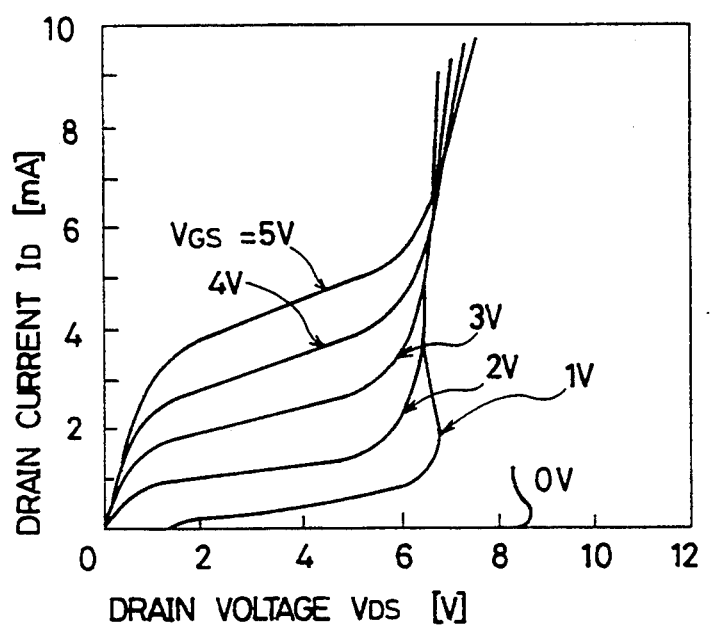
FIG. 10 is a graphic representation showing the drain voltage $V_{DS}$-drain current $I_D$ characteristics of the MOS field effect transistor shown in FIG. 9A.

In the present embodiment, a drain voltage $V_{DS}$-drain current $I_D$ characteristic is as shown by a graphic representation in FIG. 10. It is to be noted that the control characteristic of the drain current ID by the gate electrode $V_{GS}$ is improved as compared to the conventional one shown in FIG. 7.

The MOS field effect transistor in accordance with the embodiment of the present invention shown in FIGS. 9A and 9B is formed by a following manufacturing process.

Figure 11:
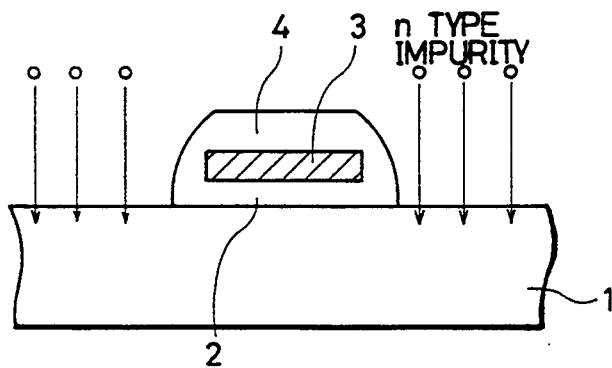
FIG. 11 is a view showing a step of implanting an n type impurity into the surface of a semiconductor substrate 1, in a process of manufacturing an MOS field effect transistor in accordance with another embodiment of the present invention.
Figure 12A:
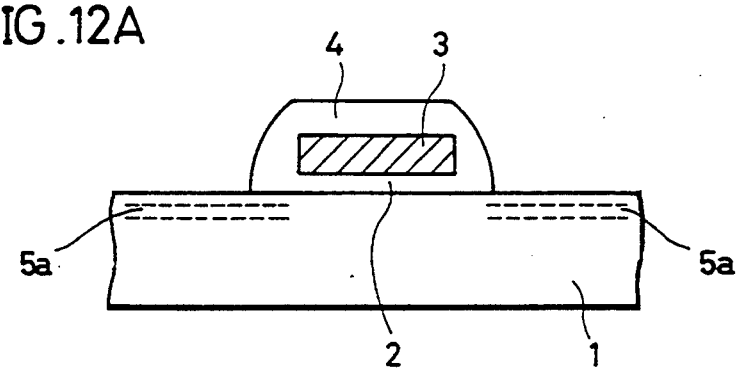
FIG. 12A is a sectional view showing a structure immediately after the impurity implantation shown in FIG. 11, FIG. 12B showing the concentration distribution of the impurity in its depth direction.
Figure 12B:
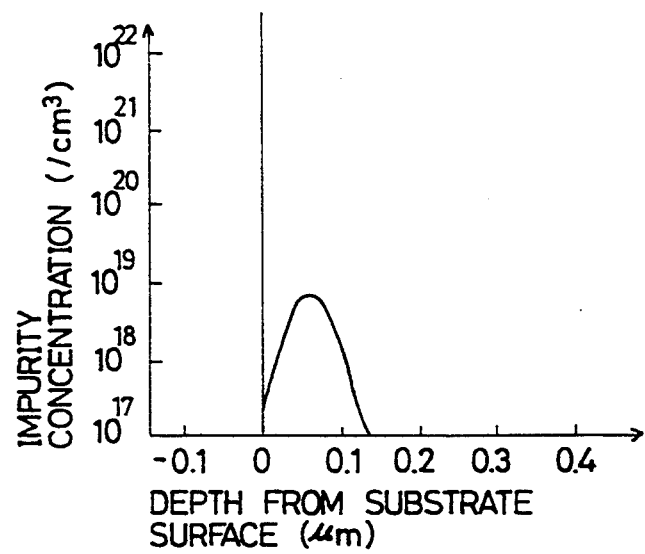

Now, referring to FIG. 11, an n type impurity As is implanted into the surface of semiconductor substrate 1 at, for example, an implantation energy 350 KeV in a dose $5 \times 10^{14}/cm^2$. An impurity implantation layer 5a having a concentration distribution as shown in FIG. 12B is formed in the vicinity of the surface of semiconductor substrate 1 as shown in FIG. 12A immediately after this implantation process.

Figure 13:
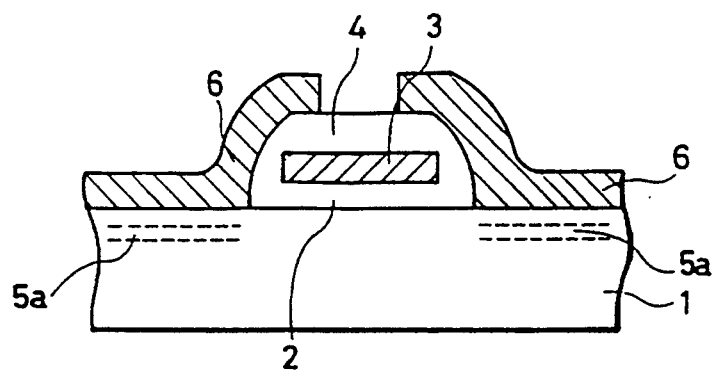
FIG. 13 is a sectional view showing a state in which polycrystalline silicon layer 6 is patterned so as to cover at least the top of an impurity implantation layer 5a in the process of manufacturing in accordance with the embodiment shown in FIG. 11.
Figure 14A:
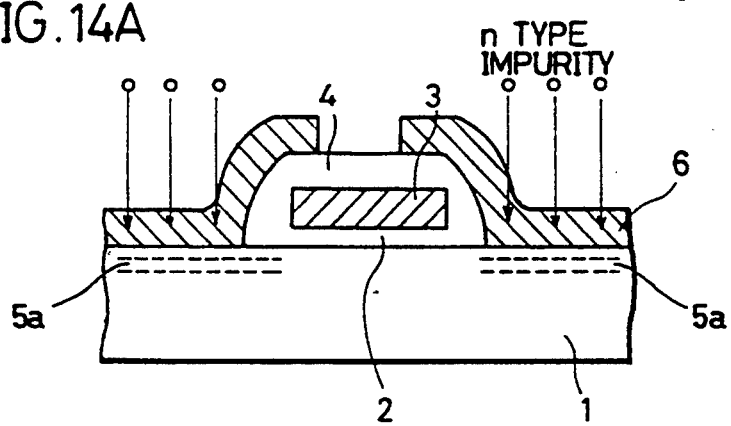
FIG. 14A is a sectional view showing a step of implanting an n type impurity into polycrystalline silicon layer 6 in the manufacturing process in accordance with the above-described embodiment, FIG. 14B showing the concentration distribution of the impurity in its depth direction immediately after the implantation.
Figure 14B:
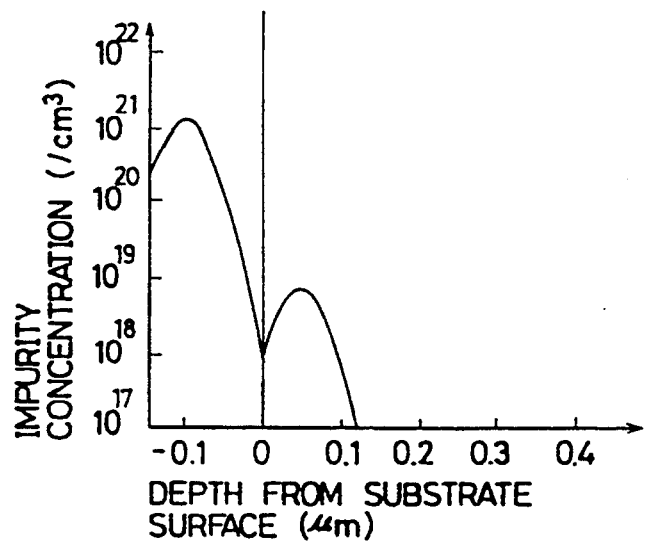
Figure 15A:
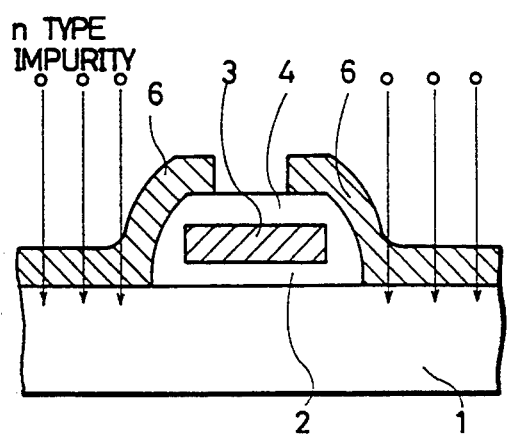
FIG. 15A is a sectional view showing a step of implanting an n type impurity into the surface of a semiconductor substrate 1 after the formation of a polycrystalline silicon layer 6 in a manufacturing process in accordance with another embodiment of the present invention, FIG. 15B showing the concentration distribution of the impurity in its depth direction.
Figure 15B:
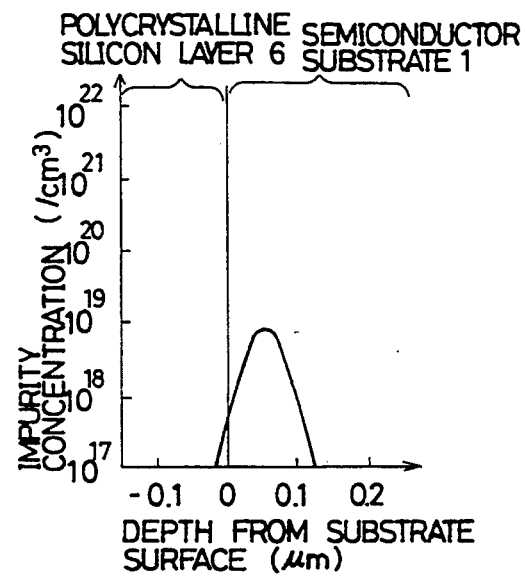

Now, a polycrystalline silicon film is deposited as thick as about 1500 Å on the entire surface of semiconductor substrate 1 and a polycrystalline silicon layer 6 is formed by patterning, covering at least the top of impurity implantation layer 5a. (see FIG. 13.) Thereafter, as shown in FIG. 14A, As is implanted into polycrystalline silicon layer 6 at, for example, an implantation energy 60 KeV, in a dose $1 \times 10^{16}/cm^2$, resulting in a concentration distribution as shown in FIG. 14B. The impurity is activated by thermal treatment thereafter, and the MOS field effect transistor shown in FIG. 9A is provided.

Now, another embodiment of a manufacturing method of a semiconductor device in accordance with the present invention will be described in conjunction with FIGS. 15A, 15B, 16A, and 16B.

In the present embodiment, an impurity is not implanted prior to the formation of polycrystalline silicon layer 6, but first impurity implantation is conducted after the formation of polycrystalline silicon layer 6. (see FIG. 15A.) In the first impurity implantation, arsenic, for example, is implanted at an implantation energy 350 KeV, in a dose $5 \times 10^{14}/cm^2$ if polycrystalline silicon layer 6 is as thick as 1500 Å, and its impurity concentration distribution comes to its peak in the position in the center of the depth (about 0.1 $\mu$m) from a surface needed to have conductivity in semiconductor substrate 1.

Then, as second impurity implantation, an n type impurity is implanted so that the peak of its concentration distribution is within polycrystalline silicon layer 6. (see FIG. 16A.) In this case, arsenic, for example, is implanted at an implantation energy 60 KeV, in a dose $1 \times 10^{16}/cm^2$, resulting in an impurity concentration distribution as shown in FIG. 16B.

Thereafter, the implanted impurity is activated by means of thermal treatment at about 900° C. for 30 minutes, and an impurity distribution similar to the embodiment shown in FIG. 9B is observed.

According to the present embodiment, the step of forming polycrystalline silicon layer 6 is not put in between impurity implantation steps, and two steps of impurity implantation can be conducted serially, thereby improving efficiency.

Now, yet another embodiment of a manufacturing method of a semiconductor device in accordance with the present invention will be described in conjunction with FIGS. 17A to 17D. Although in each of the above-described embodiments, the concentration distribution of the impurity is controlled by the two steps of impurity implantation, an n type impurity is implanted three times in the present embodiment.

Figure 16A:
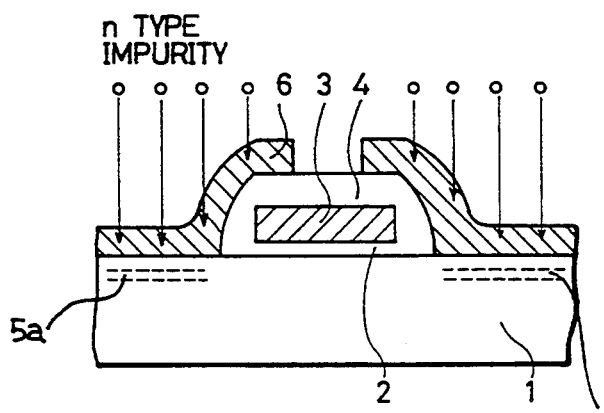
FIG. 16A is a sectional view showing a step of implanting an n type impurity into polycrystalline silicon layer 6 in the manufacturing process in accordance with the embodiment shown in FIG. 15A, FIG. 16B showing the concentration distribution of the impurity in its depth direction immediately after the implantation.
Figure 16B:
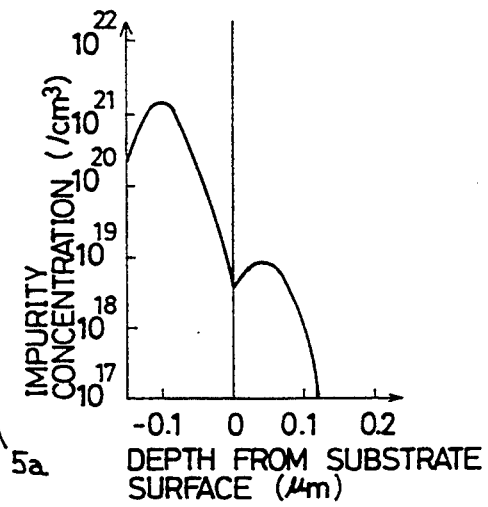
Figure 17A:
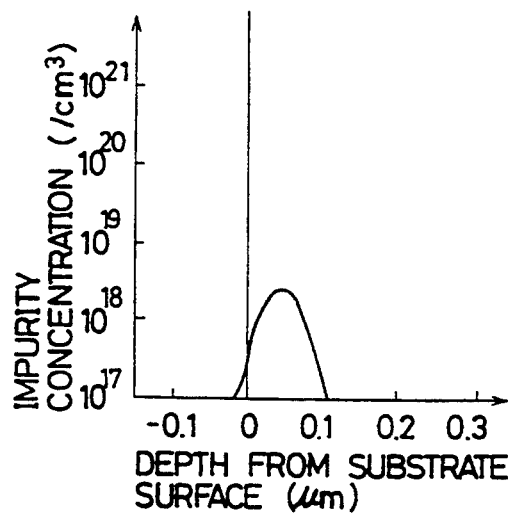
FIGS. 17A, 17B, 17C, and 17D are graphic representations showing the progress of the concentration distribution of an impurity in its depth direction between steps in a process of manufacturing an MOS field effect transistor in accordance with yet another embodiment of the present invention.
Figure 17B:
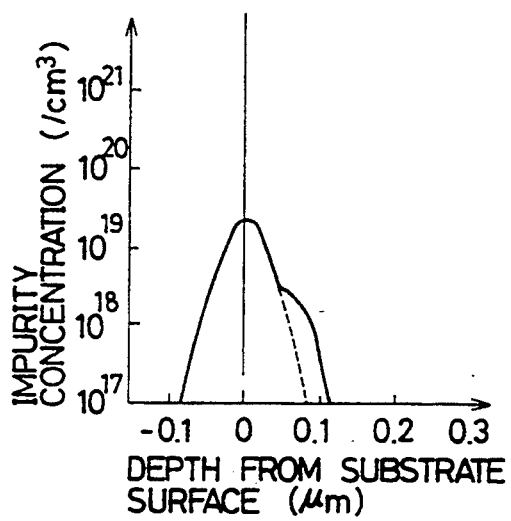

As similar to the case in FIG. 16A in accordance with the above-described embodiment, after the formation of polycrystalline silicon layer 6, arsenic, for example, is implanted at an implantation energy 350 KeV, in a dose $1 \times 10^{14}/cm^2$, resulting in a concentration distribution as shown in FIG. 17A so that the peak of the concentration distribution is in a position as deep as about 0.05 μm in semiconductor substrate 1. Thereafter, arsenic is implanted for the second time at 270 KeV, in $1 \times 10^{14}/cm^2$ so that the peak of concentration distribution comes around the surface of semiconductor substrate 1, resulting in a concentration distribution as shown in FIG. 17B.

Figure 17C:
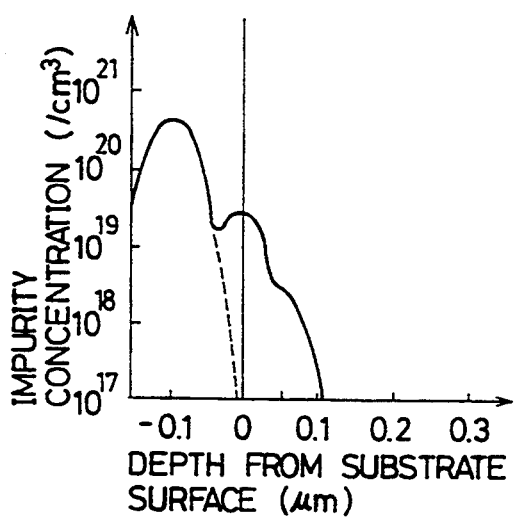

Then, arsenic is implanted for the third time under conditions, for example, at 60 KeV, in $5 \times 10^{15}/cm^2$ so that the peak of the concentration distribution comes within polycrystalline silicon layer 6, resulting in a concentration distribution as shown in FIG. 17C. Subsequently, the impurity is activated by means of thermal treatment at about 900° C. for 30 minutes, thereby achieving a concentration distributions shown in FIG. 17D.

From general consideration of the above-described embodiments, it can be understood that the concentration distribution of an impurity diffusion layer according to the present invention can be generalized using a mathematical formula as follows.

The impurity distribution N(x) in an Si substrate at the time of the first ion implantation (prior to heat treatment) in a depth x from the substrate surface is generally approximated by a normal distribution (gauss distribution) represented by the following equation.

$$N(x) = \{Ni/(\sqrt{2\pi} \ast \Delta Rp)\} \exp\{-(x - Rp)^2/(2 \ast \Delta Rp^2)\} \quad (1)$$

where Ni is the amount of impurity implanted per unit area of the semiconductor substrate surface, Rp is the average of the range of the implanted impurity ions (from the substrate surface) in the Si substrate (which depends on implantation energy and the kind of ion), and ΔRp is standard deviation of the range of the implanted impurity ions (from the substrate surface) in the Si substrate (which depends on implantation energy and the kind of ion). (2)

Accordingly, in each of the above-described embodiments, the impurity distribution immediately after implantation is approximately represented by the sum of the normal distribution, in other words, $$\begin{aligned} N(x) = &\{Ni1/(2\pi \ast \Delta Rp1)\} \exp\{-(x - Rp1)^2/(2 \ast \Delta Rp1^2)\} + \\ &\{Ni2/(2\pi \ast \Delta Rp2)\} \exp\{-(x - Rp2)^2/(2 \ast \Delta Rp2^2)\} + \\ &\{Ni3/(2\pi \ast \Delta Rp3)\} \exp\{-(x - Rp3)^2/(2 \ast \Delta Rp3^2)\} + \\ &\ldots + \\ &\{Nin/(2\pi \ast \Delta Rpn)\} \exp\{-(x - Rpn)^2/(2 \ast \Delta Rpn^2)\} \end{aligned}$$

-continued $n = 2, 3, 4 \ldots$

, where n represents the number of impurity ion implantation.

Additionally, each of the above-described embodiments provides a characteristic structure in which a conductive layer including polycrystalline silicon is formed in contact with the surface of silicon substrate.

At the shallower position exists the peak value of the impurity concentration distribution in ion implantation, which is conducted at a relatively low implantation energy, the higher peak value is produced, and therefore, the following inequalities hold.

$$Rp1 < Rp2 < Rp3 < \ldots < Rpn$$

$$Ni1 \geq Ni2 \geq Ni3 \geq \ldots \geq Nin \quad (3)$$

More specifically, Rp is in the case of implantation in the vicinity of the surface with relatively low energy, and Rp2, Rp3, and so on are the cases of implantation at the deeper positions with higher energies. And the inequalities also indicate that at the closer position to the surface implantation is conducted, the higher or the equal impurity concentration is obtained. However, 1, 2, 3 ...., n is irrelevant to the order of ion implantation.

The following equation is also established, because the peak of the impurity concentration distribution falls on the side of the conductive layer rather than the surface of the silicon substrate at least more than once among the plurality of ion implantation.

$$Rp1 < Rp2 \ldots < Rpj < 0 \quad (4)$$

where j is a natural number equal to or larger than 1 and not more than n.

However, each of the above-described formulas are based on the assumption that ion implantation is conducted into an even material formed of silicon only, because the impurity ions implanted into the conductive layer including polycrystalline silicon is believed to give approximately the same range as the silicon substrate.

If normal heat-treatment for activating an impurity, etc. is conducted after the impurity ions are implanted, the impurity concentration distribution changes due to heat diffusion. Usual heat-treatment for the activation, etc. however, requires heat treatment time (30 minutes at 900½ C.) which is only the tenth of that required for heat treatment for the purpose of heat diffusion of the impurity, and therefore, the concentration distribution does not change very much before and after the heat treatment. The impurity distribution after usual heat-treatment can therefore be approximately represented by the above formulas (1)–(4).

Figure 17D:
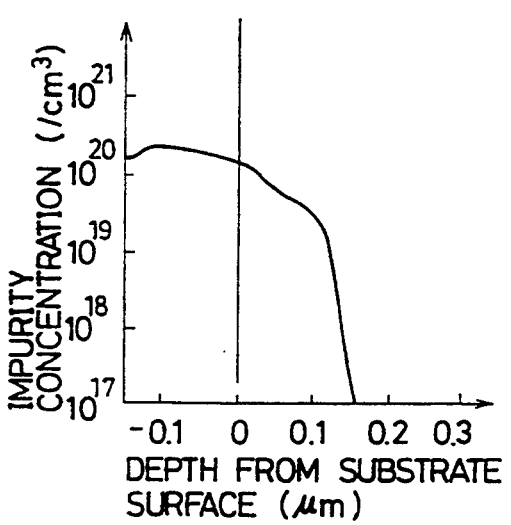

According to the present embodiment, as can be seen from a comparison between FIGS. 17D and 9B, the concentration of the impurity decreases gently as a function of depth from the surface of semiconductor substrate 1 to a depth about 0.11 m, and the concentration drastically decreases in areas deeper than that. Considering the object of the present invention to secure an impurity concentration necessary only in positions of prescribed depth needed to have conductivity in semiconductor substrate 1 and to keep the concentration low in positions deeper than that, this concentration distribution comes further close to the ideal. In other words, it can be understood from the present embodiment that the more the number of implantation is, the impurity concentration distribution to be set in its depth direction can be set more freely, thereby coming further close to an ideal concentration.

Although in the above-described embodiments, the cases in which an n channel MOS field effect transistor is formed using arsenic as an n type impurity, phosphorus, etc. may be used for the n type impurity. The present invention is by all means applicable to a p channel MOS field effect transistor in which a p type impurity such as boron is implanted into its source/drain regions.

According to a semiconductor device including an MOS field effect transistor in accordance with each of the above-described embodiments of the present invention and a manufacturing method thereof, in the concentration distribution of an impurity diffusion layer to be source/drain regions, a suitable high concentration is produced in a region having a prescribed depth needed to have conductivity, and drastically low concentrations are provided in positions deeper than that. A punch through phenomenon is suppressed in the deep positions of its channel region, thereby improving the breakdown voltage characteristic of a transistor. Consequently, an MOS field effect transistor having a gate length of 0.5 µm and less and yet achieving high performance can be implemented, thereby achieving outstanding increase in integration density.

Although the present invention has been described and illustrated in detail, it is clearly understood that the same is by way of illustration and example only and is not to be taken by way of limitation, the spirit and scope of the present invention being limited only by the terms of the claims.

What is claimed is:

1. A manufacturing method of a semiconductor device including a MOS field effect transistor, comprising the steps of:
   forming a gate electrode on the main surface of a semiconductor substrate with a gate insulating film therebetween;
   implanting an impurity of a first conductivity type in said semiconductor substrate to form source/drain regions;
   forming a polycrystalline silicon layer so as to cover the surfaces of said source/drain regions located in the positions interposing a channel region of a second conductivity type therebetween which is positioned in the surface of said semiconductor substrate under said gate electrode;
   implanting an impurity of said first conductivity type into said polycrystalline silicon layer and into said source/drain regions so that the peak of the concentration distribution of the impurity in the depth direction is within said polycrystalline silicon layer.

2. The manufacturing method of a semiconductor device including a MOS field effect transistor as recited in claim 1, further comprising a step of forming an insulating film for covering the top and sidewalls of said gate electrode between said step of forming said gate electrode and said step of forming said polycrystalline silicon layer.

3. The manufacturing method of a semiconductor device including a MOS field effect transistor as recited in claim 2, wherein
   said step of controlling said impurity concentration distribution includes a step of implanting an impurity into the surface of said semiconductor substrate, using said gate electrode and said insulating film as masks, prior to a step of forming said polycrystalline silicon layer.

4. A manufacturing method of a semiconductor device including a MOS field effect transistor as recited in claim 3, wherein said step of implanting the impurity into the surface of said semiconductor substrate, using said gate electrode and said insulating film as masks is conducted by implanting arsenic at an implantation energy of about 350 KeV, in a dose of about $5 \times 10^{14}/cm^2$.

5. A manufacturing method of a semiconductor device including a MOS field effect transistor as recited in claim 1, wherein
   said step of controlling the impurity concentration distribution includes a step of implanting arsenic into said polycrystalline silicon layer at an implantation energy of about 60 KeV, in a dose of about $10^{16}/cm^2$ after the formation of said polycrystalline silicon layer.

6. A manufacturing method of a semiconductor device including a MOS field effect transistor as recited in claim 1 further comprising a step of thermal treatment for activating the implanted impurity, only after said step of controlling the impurity concentration distribution.

7. A manufacturing method of a semiconductor device including a MOS field effect transistor as recited in claim 2 wherein
   said step of controlling the impurity concentration distribution includes the steps of:
   implanting arsenic into the surface of said semiconductor substrate at an implantation energy of about 350KeV, in a dose of about $5 \times 10^{14}/cm^2$, using said gate electrode and said insulating film as masks, prior to said step of forming said polycrystalline silicon layer; and
   implanting arsenic into said polycrystalline silicon layer at an implantation energy of about 60 KeV, in a dose $10^{16}/cm^2$, after the formation of said polycrystalline silicon layer.

8. A manufacturing method of a semiconductor device including a MOS field effect transistor as recited in claim 7 further comprising a step of thermal treatment for activating the implanted impurity only after said step of controlling the impurity concentration distribution.

9. A manufacturing method of a semiconductor device including a MOS field effect transistor, comprising the steps of:
   forming a gate electrode on the main surface of a semiconductor substrate with a gate insulating film therebetween;
   forming a polycrystalline silicon layer so as to cover the surface of source/drain regions interposing a channel region of a first conductivity type therebetween which is positioned in the surface of said semiconductor substrate under said gate electrode; and
   implanting an impurity of a second conductivity type a plurality of times into said polycrystalline silicon layer and said source/drain regions only after the step of forming said polycrystalline silicon layer and changing an implantation energy and a dose for each implantation so that the peak of the impurity concentration distribution in the depth direction is within the range of depth whose resistance is needed to be kept low in said polycrystalline silicon layer or said source/drain regions.

10. A manufacturing method of a semiconductor device including a MOS field effect transistor as recited in claim 9, further comprising a step of forming an insulating film for covering the top and sidewalls of said gate electrode between said step of forming the gate electrode and said step of forming said polycrystalline silicon layer.

11. A manufacturing method of a semiconductor device including a MOS field effect transistor as recited in claim 9, wherein
said step of controlling the impurity concentration distribution includes;
a first impurity implantation step of implanting an impurity of the second conductivity type so that the concentration distribution of the impurity comes to its peak in a position a prescribed depth from the surface of said semiconductor substrate, and
a second impurity implantation step of implanting an impurity of the second conductivity type so that the peak of the concentration distribution is positioned in said polycrystalline silicon layer.

12. A manufacturing method of a semiconductor device including a MOS field effect transistor as recited in claim 11 further comprising a step of thermal treatment for activating the implanted impurity only after said step of controlling the impurity concentration distribution.

13. A manufacturing method of a semiconductor device including a MOS field effect transistor as recited in claim 11, wherein
said step of controlling the impurity concentration distribution further includes a third impurity implantation step of implanting an impurity of the second conductivity type so that the peak of the impurity concentration distribution is positioned between the peaks of the impurity concentration distribution formed by said first and second impurity implantation steps.

14. A manufacturing method of a semiconductor device including a MOS field effect transistor as recited in claim 13 further comprising a step of thermal treatment for activating the implanted impurity after said step of controlling the impurity concentration distribution.

15. A manufacturing method of a semiconductor device including a MOS field effect transistor, comprising the steps of:
forming a gate electrode on the main surface of a semiconductor substrate with a gate insulating film therebetween;
implanting an impurity of a first conductivity type in said semiconductor substrate to form source/drain regions, whereby the peak of the concentration distribution of the impurity in the depth direction is within said substrate;
forming a polycrystalline silicon layer so as to cover the surfaces of said source/drain regions located in the positions interposing a channel region of a second conductivity type therebetween which is positioned in the surface of said semiconductor substrate under said gate electrode; and
implanting the impurity of said first conductivity type into said polycrystalline silicon layer and into said source/drain region so that the peak of the concentration distribution of the impurity in the depth direction is greater than said peak of the concentration distribution of the impurity formed by said implantation forming source/drain regions.

* * * * *